(12) United States Patent
Schaller et al.

(10) Patent No.: US 9,064,920 B2
(45) Date of Patent: Jun. 23, 2015

(54) ELECTROSTATIC CHARGE REMOVAL FOR SOLAR CELL GRIPPERS

(75) Inventors: Jason Schaller, Austin, TX (US); Robert Brent Vopat, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 529 days.

(21) Appl. No.: 13/555,168

(22) Filed: Jul. 22, 2012

(65) Prior Publication Data
US 2014/0023461 A1    Jan. 23, 2014

(51) Int. Cl.
*H05F 3/02* (2006.01)
*B65G 49/06* (2006.01)
*H01L 21/677* (2006.01)
*B25J 15/06* (2006.01)

(52) U.S. Cl.
CPC ...... *H01L 21/67742* (2013.01); *B65G 2812/16* (2013.01); *B65G 49/06* (2013.01); *B65G 2207/10* (2013.01); *B25J 15/0616* (2013.01); *H05F 3/02* (2013.01); *H01L 21/67766* (2013.01); *H01L 21/67781* (2013.01)

(58) Field of Classification Search
CPC ............ B65G 43/00; B65G 2207/10; B65G 2812/16; B65G 49/06; B25J 15/0616; H05F 3/02
See application file for complete search history.

(56) References Cited

U.S. PATENT DOCUMENTS

2003/0202830 A1* 10/2003 Oh et al. .................. 399/390
2012/0113559 A1*  5/2012 Nguyen et al. ............ 361/221

FOREIGN PATENT DOCUMENTS

| JP | S63-133644 A | 6/1988 |
| JP | 2004-276417 A | 10/2004 |
| JP | 2006-221998 A | 8/2006 |
| JP | 2008277181 A * | 11/2008 |
| JP | 2012134359 A * | 7/2012 |

OTHER PUBLICATIONS

International Search Report and Written Opinion mailed Oct. 9, 2013 for PCT/US13/050890 dated Jul. 17, 2013.

* cited by examiner

*Primary Examiner* — Gerald McClain

(57) ABSTRACT

A manufacturing system includes a gantry module, having an end effector, for moving workpieces from a conveyor system to a working area, such as a swap module. The swap module removes a matrix of processed workpieces from a load lock and place a matrix of unprocessed workpieces in its place. The processed workpieces are then moved by the gantry module back to the conveyor. Due to the speed of operation, the end effector may build up excessive electrostatic charge. To remove this built up charge, grounded electrically-conductive brushes are strategically positioned so that, as the end effector moves during normal operation, it comes in contact with these brushes. This removes this built up charge on the end effector, without affecting throughput. In another embodiment, the end effector moves over the brushes while the swap module is moving matrix to and from the load lock.

4 Claims, 9 Drawing Sheets

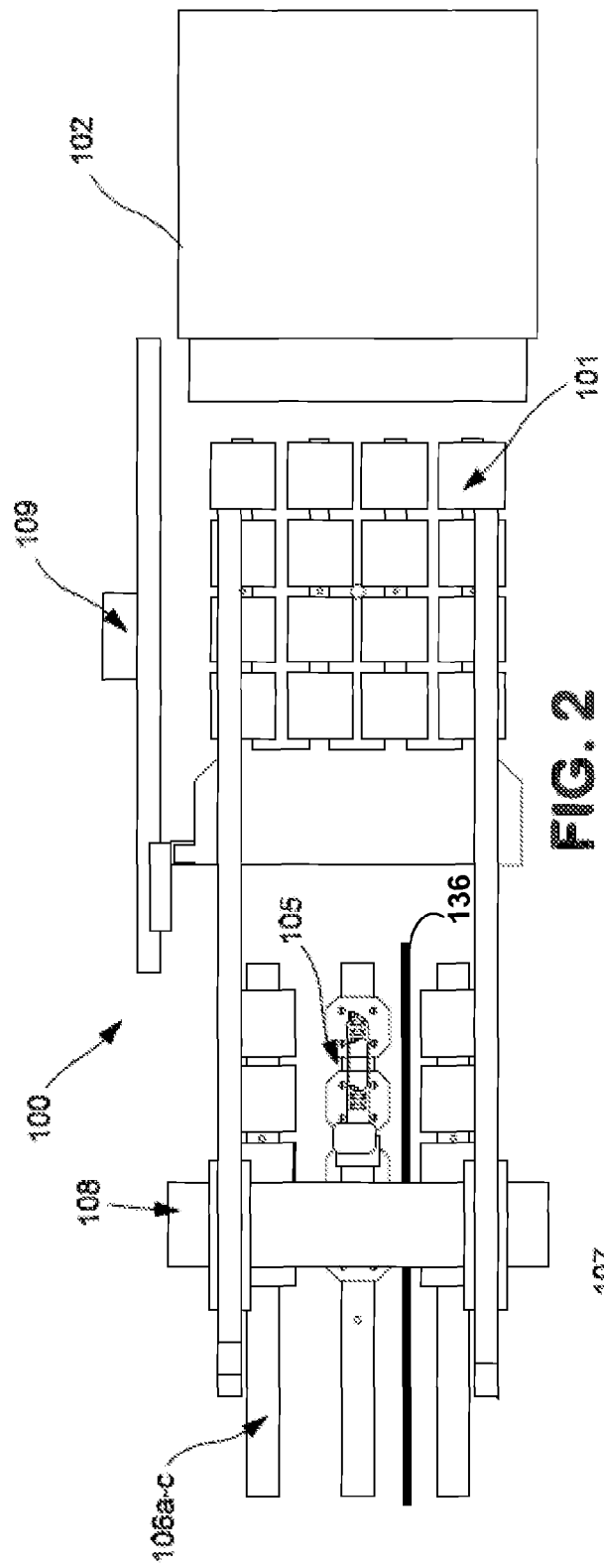
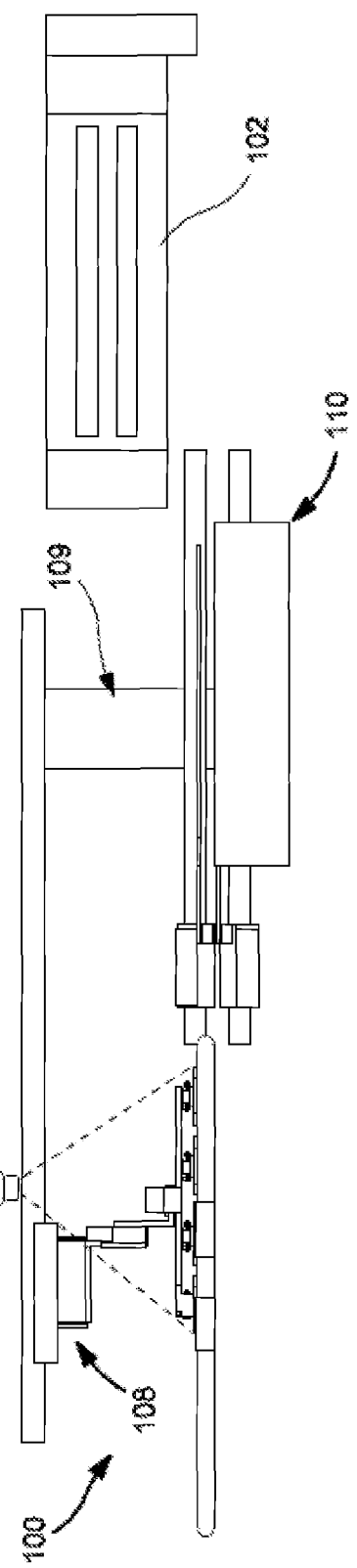
FIG. 2
FIG. 3

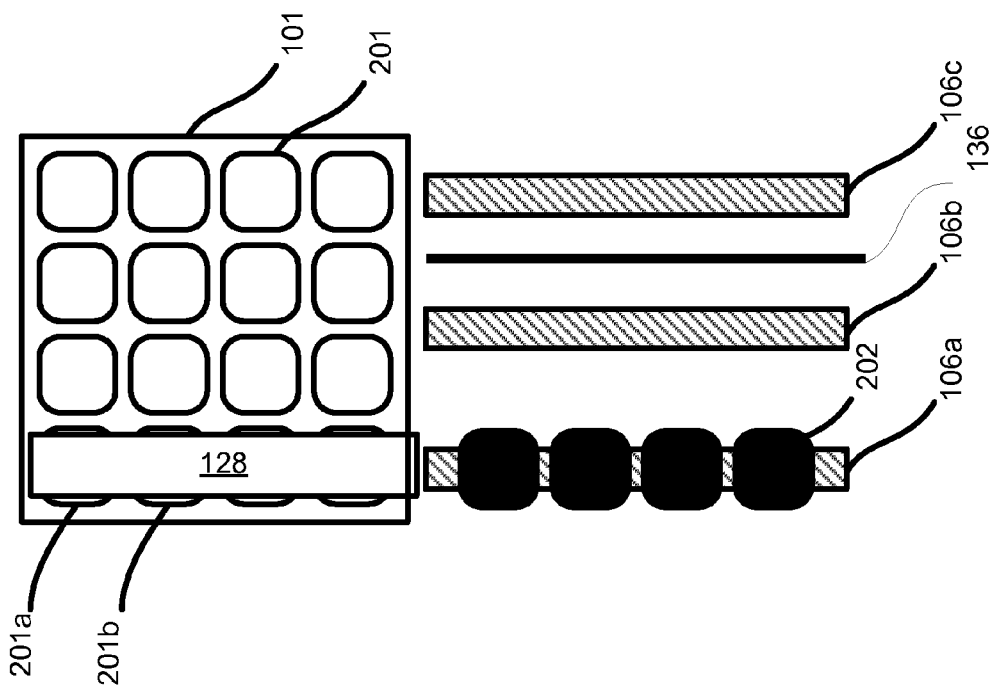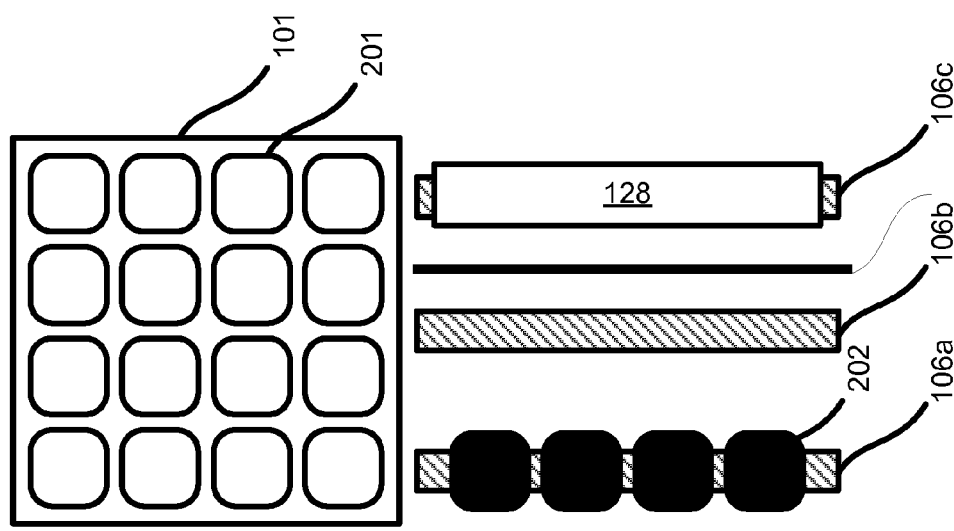

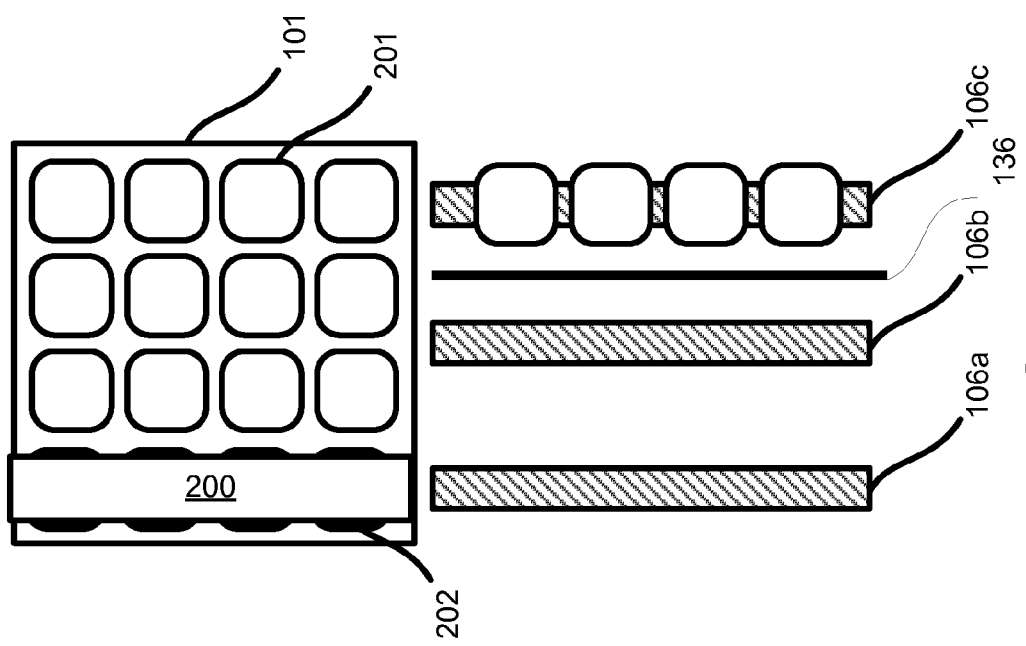

_US 9,064,920 B2_

ELECTROSTATIC CHARGE REMOVAL FOR SOLAR CELL GRIPPERS

FIELD

This invention relates to workpiece handling and, more particularly, to removal of electrostatic charge from workpiece handling apparatus in high-throughput applications.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Ion implantation has been demonstrated as a viable method to dope solar cells. Two concerns of the solar cell manufacturing industry are manufacturing throughput and cell efficiency. Cell efficiency measures the amount of solar energy that is converted into electricity. Higher cell efficiencies may be needed to stay competitive in the solar cell manufacturing industry. However, manufacturing throughput cannot be sacrificed in order to increase cell efficiency.

Use of ion implantation removes process steps needed for existing solar cell technology, such as diffusion furnaces. For example, a laser edge isolation step may be removed if ion implantation is used instead of furnace diffusion because ion implantation will only dope the desired surface. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs. Furthermore, ion implantation has been used make solar cells with higher cell efficiencies.

Therefore, any improvement to manufacturing throughput of an ion implanter or its reliability would be beneficial to solar cell manufacturers worldwide. This may accelerate the adoption of solar cells as an alternative energy source.

SUMMARY

A manufacturing system includes a gantry module, having an end effector, for moving workpieces from a conveyor system to a working area, such as a swap module. The swap module removes a matrix of processed workpieces from a load lock and place a matrix of unprocessed workpieces in its place. The processed workpieces are then moved by the gantry module back to the conveyor. Due to the speed of operation, the end effector may build up excessive electrostatic charge. To remove this built up charge, grounded electrically-conductive brushes are strategically positioned so that, as the end effector moves during normal operation, it comes in contact with these brushes. This removes this built up charge on the end effector, without affecting throughput. In another embodiment, the end effector moves over the brushes while the swap module is moving matrix to and from the load lock.

BRIEF DESCRIPTION OF THE DRAWINGS

For a better understanding of the present disclosure, reference is made to the accompanying drawings, which are incorporated herein by reference and in which:

FIG. 2 is a top perspective view of the first embodiment of a workpiece handling system illustrated in FIG. 1;

FIG. 3 is a side perspective view of the first embodiment of a workpiece handling system illustrated in FIG. 1;

FIGS. 4A-E illustrate one embodiment of workpiece handling using the workpiece handling system illustrated in FIGS. 1-3;

DETAILED DESCRIPTION

The workpiece handling system herein is described in connection with solar cell workpieces. However, the embodiments can be used with other workpieces such as semiconductor wafers, light emitting diodes (LEDs), silicon-on-insulator (SOI) wafers, or other devices. The workpiece handling system can be used with ion implanters or with other processing equipment like deposition, etching, or other workpiece processing systems. Thus, the invention is not limited to the specific embodiments described below.

Figure 1:
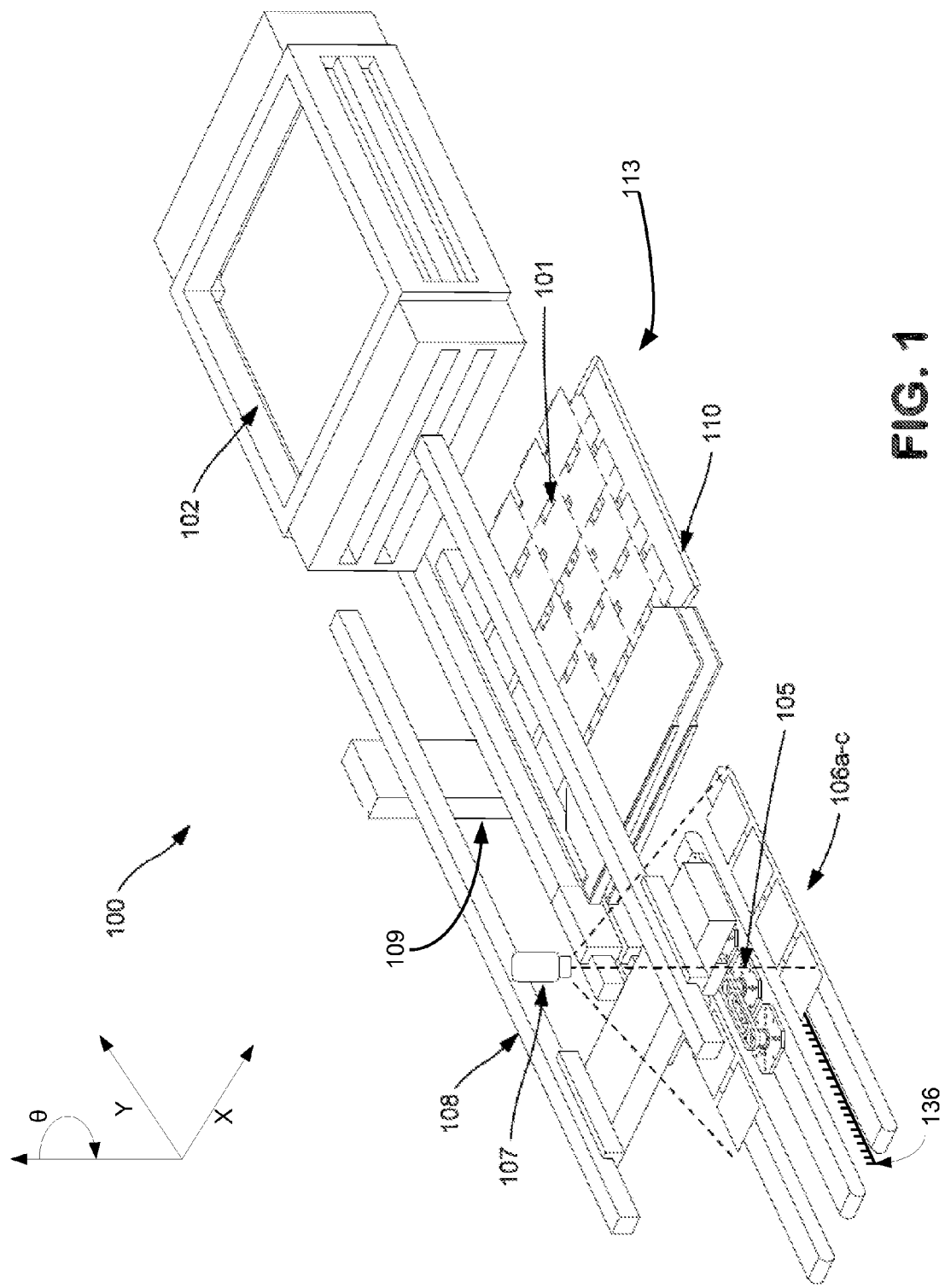
FIG. 1 is a perspective view of a first embodiment of a workpiece handling system.

The exemplary workpiece handling system 100 illustrated in FIGS. 1-3 may be capable of processing greater than approximately 2000 wafers per hour (wph) using a 4×4 matrix of workpieces. Of course, other workpiece matrix designs may be used and the embodiments herein are not limited merely to a 4×4 matrix. Other sizes, such as a 2×2 or 2×4 matrix, also may be used. These figures represent the workpiece handling system, the individual components of which will be described in more detail below. FIG. 1 shows a perspective view of the belt modules, gantry module, matrix, build station, swapbot and load locks. FIGS. 2 and 3 show a top view and side view of these components, respectively.

This matrix 101 of workpieces may be placed in a carrier that has individual slots or depressions to hold workpieces. In an alternate embodiment, no carrier is used for the workpieces. The matrix 101 instead is handled by robots or other means before and during processing. The matrix in this instance may be held on an electrostatic or mechanical clamp, or by gravity.

This workpiece handling system 100 transfers workpieces from a cassette or other interface, builds the matrix 101, and moves the matrix 101 into the load lock 102. The reverse process also may be performed by the workpiece handling system 100 to transfer workpieces back to the cassette or other interface. The load lock 102 is connected to an ion implanter or some other processing tool.

In this embodiment, three belt modules 106*a-c* may transport the workpieces from the cassette. The transport of the workpieces may be performed at a specified speed, interval, or pitch. A robot may be used to place the workpieces onto the belt modules 106*a-c*.

An array of brushes 136 that are grounded and electrically-conductive, such as carbon fiber brushes, may be located between adjacent belt modules 106. While only one of these brushes 136 is illustrated in FIGS. 1-2, more than one may be used and one of these brushes 136 maybe located between each of the adjacent belt modules 106. Other suitable electrically conductive materials may also be used. The thickness of these brushes may be sufficient to ensure that the brushes do not deform or break after prolonged use. These brushes 136 may be tall enough to ensure contact with the end effector, but not so tall that they inadvertently contact adjacent components. In some embodiments, the brushes 136 are longer than the length of the end effector (along its longest dimension), such that all surfaces of the grippers are contacted when the end effector 105 passes over the brushes 136. Of course, a shorter array may be used, however, extra movements of the end effector 105 will be required to insure that all surfaces of the grippers contact the brushes 136. In the event that the grippers are spaced slightly apart, the array of brushes 136 may have gaps in it, corresponding to the spacing between grippers. In other words, while a continuous linear array of brushes 136 may be used, other configurations are also possible. The distal end of each brush 136 is adapted to contact the end effector 105 as it moves over the brush 136. The proximal end of each brush 136 is electrically connected to ground.

The ground connection may established by connecting a wire from the brushes 136 to a ground point on the frame. In one embodiment, the brushes 136 may be crimped into a strip of metal. This strip of metal may have either a through-hole or tapped hole that a ground wire may be connected to. This ground wire may be any standard conductive wire with suitable attachments on each end, such as a ring lug. The distal end of the wire may be connected to a suitable ground location on the frame of the workpiece handling apparatus 100, which may be tied to earth ground.

At the end of the belt modules 106a-c, a camera 107 and a controller are used to determine the position of each of the workpieces and to determine if the position or orientation of the workpieces needs to be corrected during the transfer to the matrix 101. More or less than three belt modules 106a-c may be used in other embodiments. Each of these belt modules 106a-c may be designated for load or unload of workpieces or may be used for both loading and unloading.

A gantry module 108 picks workpieces from the belt modules 106a-c and builds the matrix 101, such as by using electrostatic, mechanical, or vacuum forces. The gantry module 108 may move in three dimensions and may also achieve rotational motion. This gantry module 108 may use information from the camera 107 and controller to correct the position or orientation of the workpieces. The gantry module 108 also may remove workpieces from the matrix 101 to places onto the belt modules 106a-c for transfer back to the cassette or other interface.

The gantry module 108 may have at least one y-axis actuator, one x-axis actuator, one z-axis actuator, and a tilt, or rotational, actuator. This provides four degrees of freedom and enables pick-and-place operation. The gantry module 108 can correct the workpieces in the x, y, and θ (tilt) directions. The gantry module 108 also can transport the workpieces from any of the belt modules 106a-c to any of the positions in the matrix 101. Rotation or tilting in the θ direction may be performed by the gantry module 108.

The end effector 105 of the gantry module 108 is a multi-gripper design that may be a smaller version of the matrix 101. Thus, while the matrix 101 may be 4×4 workpieces, the gantry module 108 may be 1×4 or some other design. The workpieces may be corrected by the gantry module 108 either individually or as a 1×4 group.

In one embodiment of operation, the gantry module 108 takes four workpieces that have been processed and places these on one of the belt modules 106a-c. The gantry module then takes four unprocessed workpieces from a different one of the belt modules 106a-c and places these unprocessed workpieces in the matrix 101. This reduces the total amount of travel time and the time that the gantry module 108 is not transporting workpieces. The unprocessed workpieces may be placed in the matrix 101 where the previously processed workpieces were removed from. This process may be repeated and the combined load and unload of the matrix 101 by the gantry module 108 may be used for the entire matrix 101. Of course, the gantry module 108 may fully unload the matrix 101 before placing unprocessed workpieces on the matrix 101.

In some embodiments, a swap module 109 (using at least one "swap robot" or "swapbot") may be used to place the matrix 101 into the load lock 102. This swap module 109 may be a linear actuator. There may be one or more than one swap robots in the swap module 109. These may, for example, hold an empty carrier and a full carrier. One swap robot may be parked out of the way during loading and unloading. Each swap robot may have a z-axis actuator and one or more y-axis actuators for each of the blades. The first swap robot may pick up unprocessed workpieces in the matrix 101 from the build station 110 and the second swap robot may extend into the load lock 102 to pick up processed workpieces. The processed workpieces are removed from the load lock 102 and the unprocessed workpieces are placed in the load lock 102. The processed workpieces are returned to the build station for unloading while the unprocessed workpieces are implanted or otherwise processed.

The building of the matrix 101 may be coordinated with the pumping down or venting of the load lock 102. This may increase throughput of the system attached to the load lock 102, such as an ion implanter.

Figure 6:
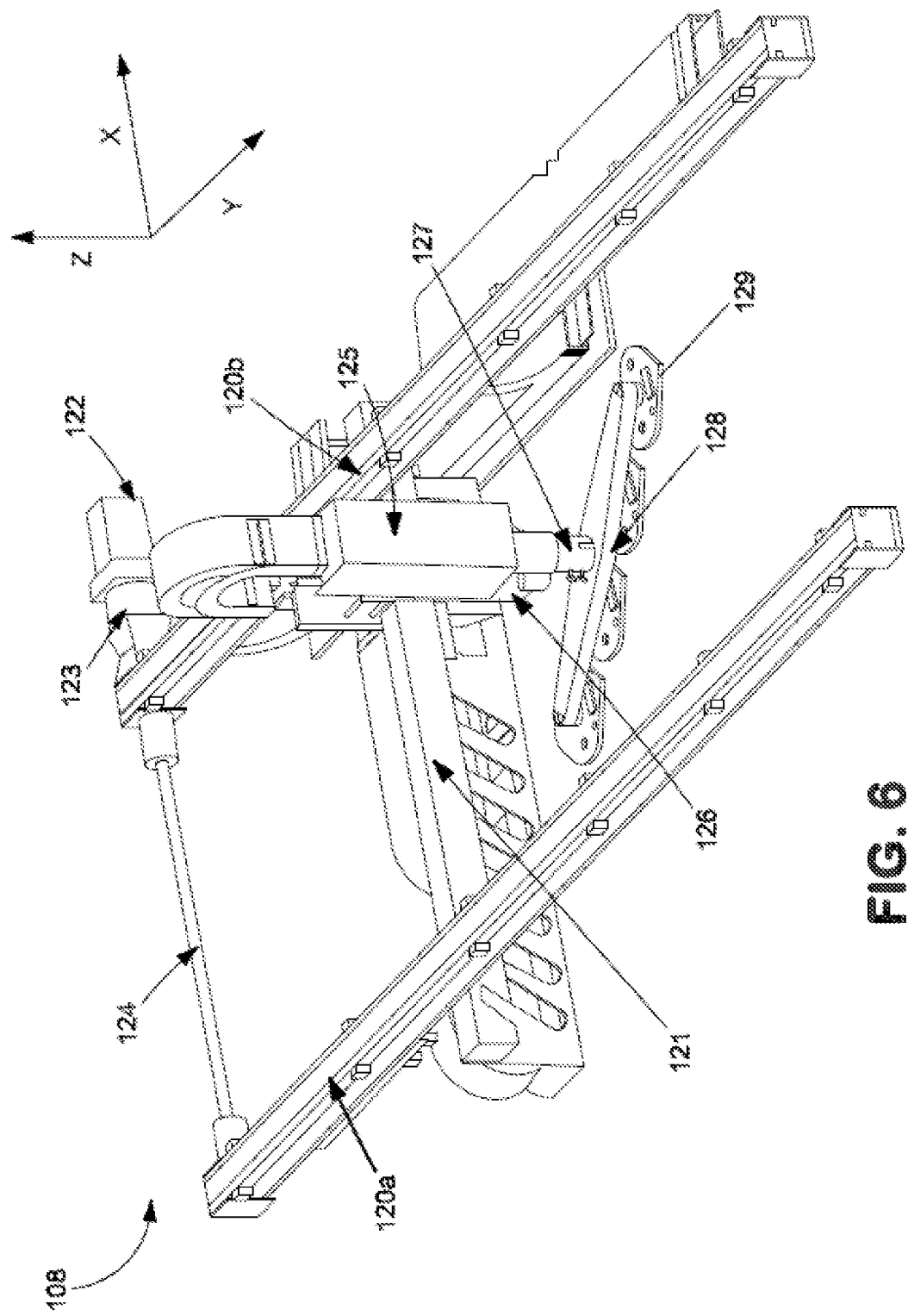
FIG. 6 is an embodiment of a gantry module as illustrated in FIG. 1.

FIG. 6 shows an expanded view of the gantry module 108. The gantry module 108 has two rails, or Y actuators 120a-b, on which a crossbar, or X actuator 121, moves. In some embodiments, a servo motor 122 is positioned on one of the Y actuators 120a-b with a gear box 123 and a drive shaft 124. The rotation of the servo motor 122 causes corresponding rotation in the drive shaft 124, which, in turn, causes X actuator 121 to move. The robot head 125 is located on the X actuator 121. Through movement of the Y actuators 120a-b and X actuator 121, the robot head 125 may move in the X and Y directions. The robot head 125 also has a Z actuator 126, which allows the robot head 125 to move up and down as necessary.

The robot head 125 also has an end effector 128. In some embodiments, the end effector 128 may include a plurality of grippers 129 at its distal end. The grippers 129 may use any suitable system for picking up and holding the workpieces, including but not limited to Venturi device-based suction systems and vacuum systems. In some embodiments, the suction to each gripper 129 is separately controlled such that one gripper may be picking up or holding a workpiece, while another gripper is inactive. These grippers 129 may be arranged in any configuration, such as a 1×4 linear array as shown in FIG. 6. In some embodiments, such as that shown in FIG. 6, the end effector 128 may have the ability to rotate about the Z axis, where this rotation is described as tilt or θ axis rotation in this disclosure. This rotational actuator allows the end effector (and the plurality of grippers) to be rotated as described in more detail with respect to FIGS. 5A-E.

The gantry module 108 also has a controller (not shown), which controls the movements of the various actuators and grippers. Of course, more than one controller can also be used if desired. The controller includes a processing unit, a storage element and an input/output module. The storage element contains instructions which allow the gantry module 108 to execute the sequences described herein, as well as any other desired movements.

The end effector 128 and the grippers 129 each may have a large surface area, and therefore may be susceptible to electrostatic charge build up as the end effector 128 is rapidly moved from one position to another. In some embodiments, electrostatic charges in excess of 3000 V may accumulate on the grippers 129. This accumulated charge tends to attract the workpieces and makes releasing of workpieces more difficult, as the workpieces tend to remain attached to the gripper 129, even in the absence of any suction force holding the workpiece in place. As described earlier, grounded electrically conductive brushes, such as carbon fiber brushes, may be incorporated in the system 100, such as between adjacent belt modules 106*a-c*. As will be described in more detail below, the end effector 128 is moved such that the grippers 129 contact the brushes 136 illustrated in FIGS. 1-2, thereby removing the accumulated electrostatic charge, as required. To protect the workpieces, the motion of the end effector 128 is such that contact is only made with the brushes 136 when the grippers 129 are not carrying workpieces.

Figure 4D:
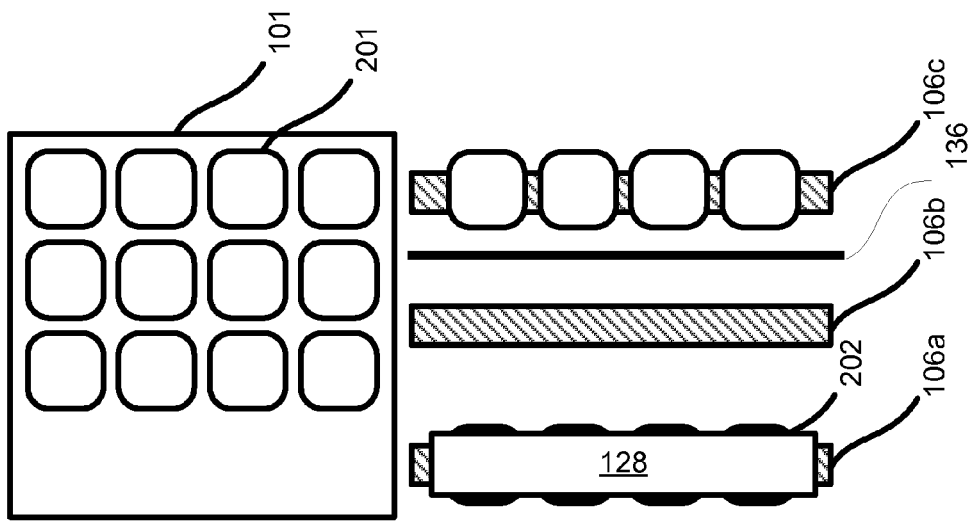

Having described the structural components of the gantry module 108, its operation and interaction with the brushes 136 will be described. FIGS. 4A-E illustrate one embodiment of workpiece handling using the workpiece handling system illustrated in FIGS. 1-3. In FIG. 4A, the end effector 128, which may be part of the gantry module 108 of FIG. 6, is positioned over a first belt module 106*c*. This is done by moving the X actuator 121 and the Y actuators 120*a-b*, as described above. In this embodiment, an array of brushes 136 is disposed between belt module 106*b* and belt module 106*c*.

At this time, the matrix 101 may contain sixteen processed workpieces 201 in a 4×4 arrangement. Other arrangements may also within the scope of the disclosure. One belt module, in this instance belt module 106*a*, contains unprocessed workpieces 202 (shaded in the embodiment of FIG. 4A).

In FIG. 4B, the gantry robot head, and specifically, the end effector 128, is moved from its previous position and is positioned over the matrix 101. The end effector 128 then picks up four processed workpieces 201 from a row of the matrix 101. The gantry module 108 may correct the position or tilt of the processed workpieces 201 after these have been gripped or picked up. In other embodiments, the gantry module 108 corrects the position or tilt of the workpieces before they are picked up. For example, in one embodiment, the gantry module 108 uses the camera 107 (as seen in FIG. 1) to determine the tilt of a first processed workpiece 201*a*. The end effector 128 will then pick up the processed workpiece 201*a*. The gantry module 108 will then utilize the camera 107 (as seen in FIG. 1) to determine the position and tilt of the second processed workpiece 201*b*. The gantry module 108 will then rotate the end effector, which is holding processed workpiece 201*a*, to align with processed workpiece 201*b*. Once aligned, the end effector will pick up the second processed workpiece 201*b*. The gantry module 108 may repeat this sequence until each gripper 129 of the end effector 128 has picked up a processed workpiece 201.

Figure 4C:
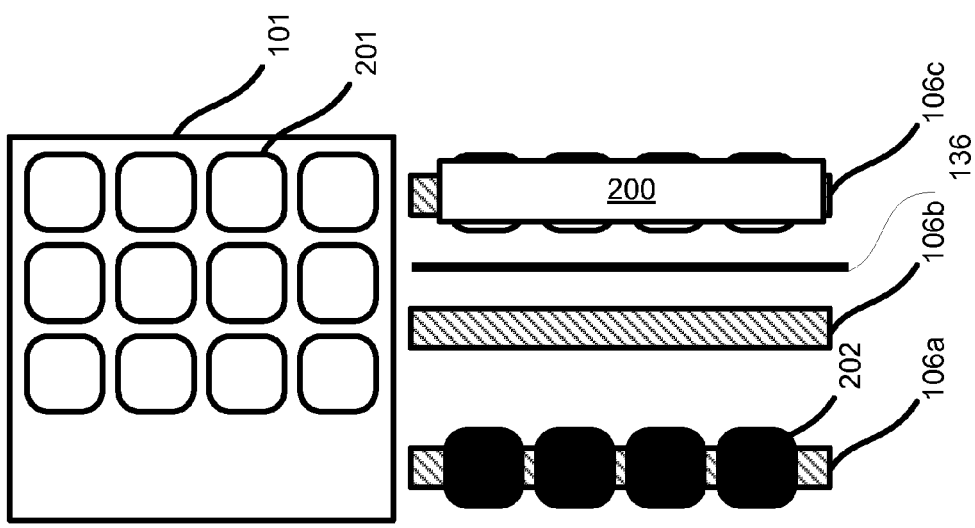

In FIG. 4C, the gantry robot 200 has transported the four processed workpieces 201 to one of the belt modules, in this case belt module 106*c* for unloading. Since the end effector 128 is transporting workpieces, it travels at a vertical height sufficient to insure that the processed workpieces 201 do not touch the brushes 136. Through the use of a Z actuator 126, it is possible to maintain the end effector 128 at various heights, as required. Once the end effector 128 is positioned over the belt module 106*c*, it places the processed workpieces 201. In the case where the processed workpieces 201 were aligned as they were picked up, the end effector 128 simply places the processed workpieces 201 on the belt module 106*c*.

In FIG. 4D, the gantry module 108, after placing processed workpieces 201, positions the end effector 128 over the unprocessed workpieces 202 disposed on belt module 106*a*, and picks these up. In moving from belt module 106*c* to belt module 106*a*, the end effector 128 may be maintained at a vertical height which allows the end effector 128, and particularly the grippers 129, to contact the brushes 136. Since the grippers 129 are unoccupied, there is no risk of damage to workpieces. Since these brushes 136 are grounded, contact with the grippers 129 removes an accumulated charge from the grippers 129.

In FIG. 4E, the gantry module 107 moves the robot head and places the four unprocessed workpieces 202 into the matrix 101. The unloaded processed workpieces 201 may have been removed to the cassette or other interface using one of the belt modules 106*a-c*. More unprocessed workpieces 202 may be loaded onto one of the belt modules 106*a-c*. This transfer process is repeated until the processed workpieces 201 are unloaded from the matrix 101 and the unprocessed workpieces 202 have been loaded into the matrix 101.

Figure 5A:
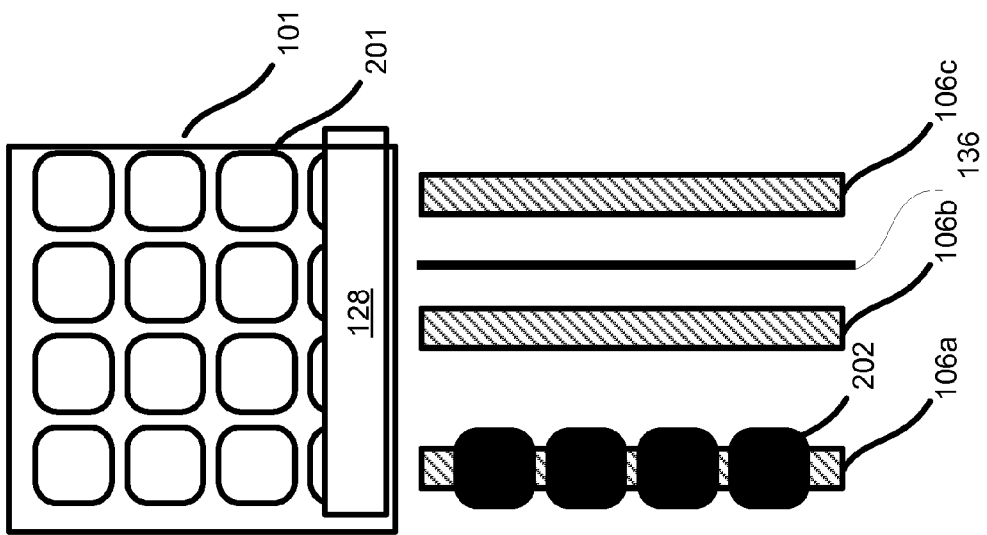
FIGS. 5A-E illustrate an embodiment of workpiece handling using the workpiece handling system illustrated in FIG. 6.
Figure 5B:
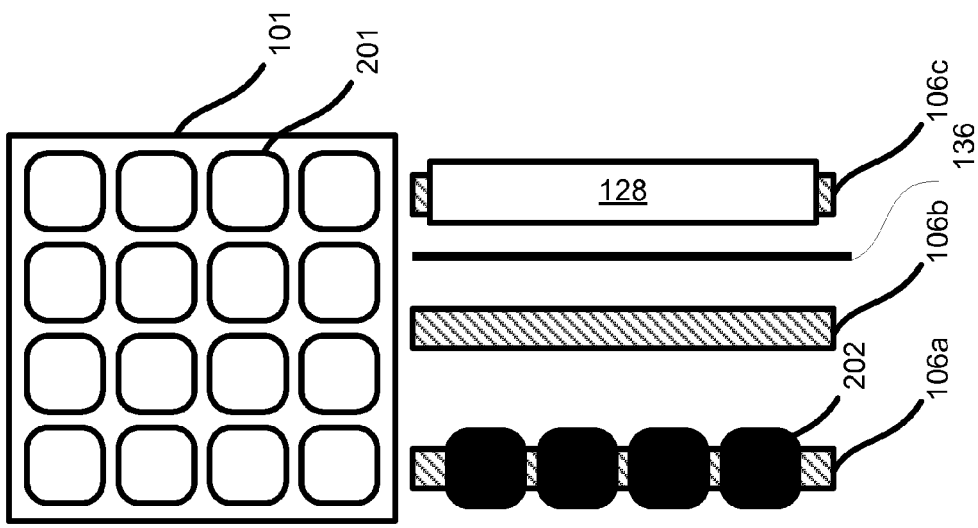
Figure 5D:
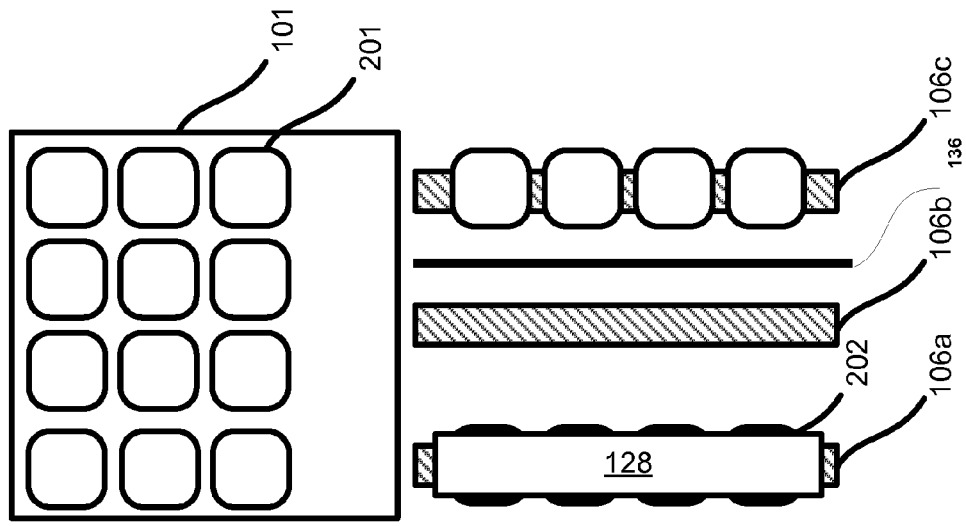
Figure 5C:
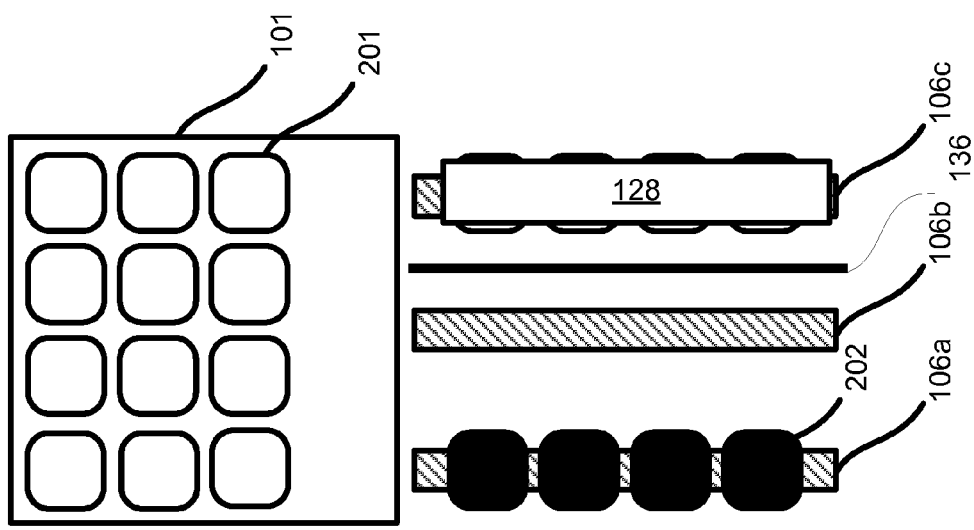
Figure 5E:
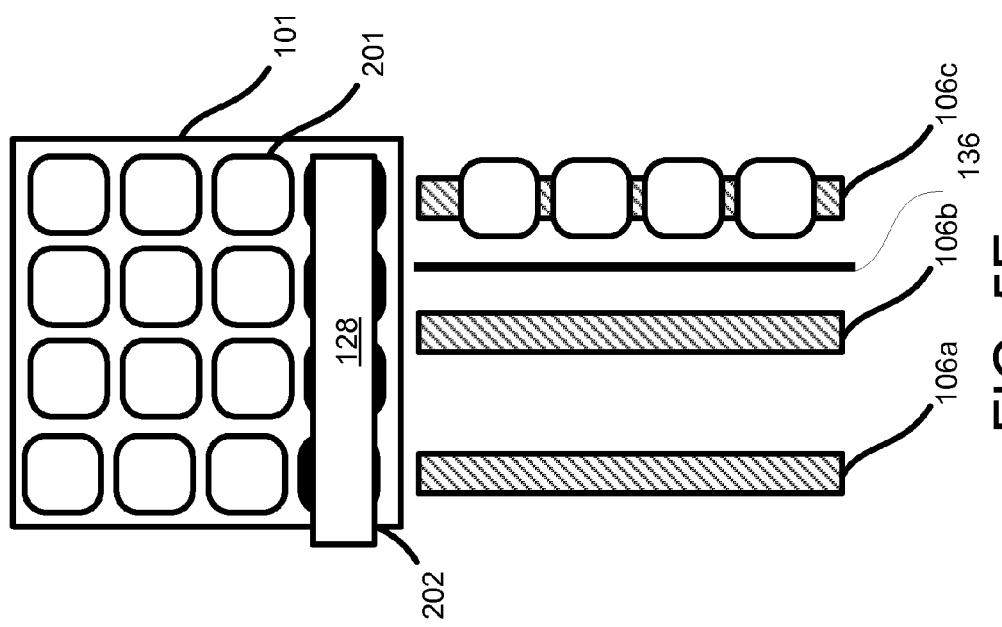

FIG. 5A-E shows a second embodiment where workpieces are being transported. In this embodiment, the end effector 128, which may be part of the gantry module 108 of FIG. 6, transfers four processed workpieces 201 from the matrix 101 and places these four processed workpieces 201 on one of the belt modules 106*a-c*. However, the end effector 128 rotates 90° (or −90°) between the picking up of the processed workpieces 201 from the matrix 101 and the placing of those processed workpieces 201 on the belt module 106*a-c*, as shown in FIGS. 5B-5C. Similarly, the end effector 128 rotates 90° (or −90°) when transferring unprocessed workpieces 202 from the belt modules 106*a-c* to the matrix 101, as shown in FIGS. 5D-5E. As before, alignment can be done as the workpieces are being picked up or placed, and this alignment may be performed at the belt module 106*a-c*, at the matrix 101, or at both locations. In this embodiment, the end effector 128 travels at a vertical height that insures contact with the brushes 137 when moving between the positions shown in FIG. 5C and FIG. 5D. At all other times, the end effector 128 travels at a vertical height sufficient to avoid the brushes 136.

It should be noted that, although the brushes 136, are illustrated as being disposed between belt module 106*c* and belt module 106*b*, the invention is not limited to this embodiment. For example, the brushes may also be placed between belt module 106*a* and belt module 106*b*. In some embodiments, conductive brushes 136 may be disposed in both locations. One benefit of disposing the conductive brushes in these locations is efficiency of movement for the end effector 128. In the two embodiments illustrated in FIGS. 4A-E and FIGS. 5A-E, during normal operation, the end effector 128 periodically passes over the location of the brushes 136 when it is not carrying any workpieces. Thus, no special movements are required to force the end effector 128 and grippers 129 to come into contact with the brushes 136.

Thus, in these embodiments, the conductive brushes 136 are disposed in a region that the end effector 128 passes over during normal operation. In these embodiments, the end effector 128 travels at a first vertical height over the brushes 136 when it is carrying workpieces, and at a second vertical height, less than the first vertical height, when it is not carrying workpieces. In this way, the end effector 128 does not contact the brushes 136 with workpieces, which may damage of dislodge the workpieces.

Of course, the brushes 136 may be disposed in other locations. For example, the brushes 136 may be disposed on the outside edge of belt module 106*c* (i.e. away from belt module 106*b*). In this embodiment, the end effector 128 must move specifically to this region in order to guarantee contact between the grippers 129 and the brushes 136. However, since the end effector 128 does not pass over the brushes 136 in this location, the end effector 128 does not have to move at different vertical heights, as was described above.

It should be noted that while the figures show a particular embodiment of a workpiece handling apparatus, the disclosure is not limited to this embodiment. Any robot system where the motion of the end effector causes accumulation of electrostatic charge may be modified to include the brushes described herein.

For example, a robot system may have a source of workpieces and a destination, where the robot moves workpieces from the source to the destination. As the robot moves toward the source to retrieve a workpiece, it may contact the brushes. As it moves back toward the destination, carrying a workpiece, it avoids the brushes.

In another embodiment, the robot system may have a source, a destination and a working area, such that the robot moves a workpiece from the source to the working area, and then from the working area to the destination. After this, the robot system may move to the source to retrieve another workpiece. Thus, as the robot moves from the destination to the source, it is not carrying a workpiece and therefore can contact the brushes.

Therefore, in some embodiments, the end effector of the robot system contacts the brushes when moving from the destination to the source. In these embodiments, the end effector may be moved to avoid the brushes during any other movements. The brushes may be avoided by changing the vertical height of the end effector, or by modifying its path to avoid the conductive brushes.

In some embodiments, such as that shown in FIGS. 4A-E and FIGS. 5A-E, the source and destination may be the same area. In this embodiment, the end effector still contacts the brushes when moving from the destination (i.e. the location where the processed workpiece was placed) to the source (i.e. the location where an unprocessed workpiece is picked up). Again, in other movements, the brushes may be avoided by varying the vertical height of the end effector or modifying the path of the end effector to avoid the brushes.

In another embodiment, the end effector is moved over the brushes 136 during idle time. For example, referring back to FIG. 1, the end effector 105 moves workpieces from the belt modules 106a-c to the matrix 110. Once the matrix is filled, the swapbot 109 moves that matrix 110 to a load lock 102 and retrieves a previously processed matrix. While this action is happening, the end effector 105 is idle, as it cannot move workpieces to the matrix 110. Idle time is defined as the time when workpieces are being processed in the working area 113, making it impossible to place or remove workpieces from the working area 113.

After the end effector 105 has moved all the workpieces to the working area 113, and while the workpieces are being processed, making the working area 113 unusable, the end effector 105 moves over the brushes 136. In some embodiments, the end effector 105 passes over or sweeps past the brushes a plurality of times, contacting it each time, to remove electrostatic charge. In other embodiments, the end effector 105 moves to a position where it contacts the brushes and remains stationary while in contact with the brushes 136.

In some embodiments, the entire process of removing electrostatic charge occurs entirely within the idle time, such that throughput is not affected at all. In other words, after the last workpiece is placed on the matrix 110, the end effector 105 moves over the brushes. It then returns to the working area 113 before the processed matrix has been retrieved and placed in the working area 113. In other embodiments, the process of removing electrostatic charge occurs at least partially during the idle time, such that the end effector 105 returns to the working area 113 after the processed workpieces have already been delivered.

In this embodiment, the brushes 137 may be located in any position accessible by the end effector 105. In other words, the brushes 136 may be on the outside edge of the belt module 106c, or oriented in a direction perpendicular to the belt modules 106. As was described with respect to the other embodiments, the end effector 105 contacts the brushes 136 when it is not carrying any workpieces. In some embodiments, the end effector 105 moves over the brushes 136 during every sufficiently long idle time. In other embodiments, the end effector 105 does not move over the brushes during every idle time. The frequency may be determined based on the rate at which charge accumulates on the end effector 105.

While the above example illustrated use of a swapbot 109 as the robot used to process workpieces in the working area 113, the invention is not limited to this embodiment. Idle time is defined as any processing steps which make the working area 113 unavailable to the end effector.

In other embodiments, both schemes for removing charge are employed. In other words, the end effector 105 is moved to the brushes 136 during idle times, and also contacts the brushes during normal operation.

The use of the grounded conductive brushes has advantages over prior art approaches to electrostatic accumulation. In the prior art, system utilize blowoff systems, whereby a positive pressure is applied to the workpiece by the gripper to remove it from the gripper. This system requires additional components to supply gas lines to each gripper. In addition, the pressure used to blow the workpieces off the gripper negatively affects the accuracy of the placement of those workpieces. The present system does not require any added complexity in the gripper and end effector system, and maintains greater accuracy in workpiece placement.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of removing electrostatic charge from an end effector of a workpiece handling system, comprising:
   using said end effector to pick up a workpiece from a source;
   moving said end effector with said workpiece to a location;
   placing said workpiece at said location;
   returning to said source to retrieve a second workpiece; and
   contacting brushes that are grounded and electrically-conductive with said end effector while moving to said source and when said end effector is not carrying a workpiece,
   wherein the brushes are always tied to earth ground.

2. The method of claim 1, wherein said end effector travels at a first vertical height while moving to said location, and a second vertical height, less than said first vertical height, while returning to said source.

3. The method of claim 1, wherein said location is a destination.

4. The method of claim 1, wherein said location is a working area, and said method further comprises moving workpieces from said working area to a destination prior to returning to said source to retrieve a second workpiece.

\* \* \* \* \*